US006441656B1

(12) United States Patent
Yee et al.

(10) Patent No.: US 6,441,656 B1
(45) Date of Patent: Aug. 27, 2002

(54) CLOCK DIVIDER FOR ANALYSIS OF ALL CLOCK EDGES

(75) Inventors: Gin S. Yee, Sunnyvale; Drew G. Doblar, San Jose, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/919,033

(22) Filed: Jul. 31, 2001

(51) Int. Cl.$^7$ ................................................ H03K 21/00
(52) U.S. Cl. ................ 327/115; 327/117; 327/166; 327/235; 377/47; 708/103; 331/51
(58) Field of Search .................. 327/113–115, 117, 327/165, 166, 231, 233, 235–239, 241, 254–259, 295, 297; 377/47; 708/101, 103; 331/51, 52; 375/362, 376, 371; 365/233, 233.5

(56) References Cited

U.S. PATENT DOCUMENTS

| | | | |
|---|---|---|---|
| 5,574,756 A | * 11/1996 | Jeong | 327/147 |
| 5,781,054 A | * 7/1998 | Lee | 327/231 |
| 6,194,939 B1 | * 2/2001 | Omas | 327/160 |
| 6,316,982 B1 | * 11/2001 | Gutierrez, Jr. | 327/160 |

* cited by examiner

*Primary Examiner*—Timothy P. Callahan
*Assistant Examiner*—Minh Nguyen
(74) *Attorney, Agent, or Firm*—Rosenthal & Osha L.L.P.

(57) ABSTRACT

A method for dividing a high frequency clock signal for analysis of all clock edges has been developed. The method includes receiving a high frequency clock signal and dividing it up into multiple phases that represent respective edges of the clock signal. The initial phases are generated by the divider with each subsequent phase lagging its preceding phase by one clock cycle. Additional subsequent phases are generated by inverting corresponding initial phases.

15 Claims, 5 Drawing Sheets

CLOCK DIVIDER FOR ANALYSIS OF ALL CLOCK EDGES

BACKGROUND OF INVENTION

1. Field of the Invention

The invention relates generally to a micro-electronic clock system. More specifically, the invention relates to a clock divider that allows for analysis of all of the clock edges.

2. Background Art

A clock signal is critical to the operation of a microprocessor based computer system. The clock signal initiates and synchronizes the operation of almost all of the components of such a computer system. Consequently, the detection of any errors or problems with the clock signal is vitally important.

A phased locked loop (PLL) is an important part of a clock signal distribution system. A PLL is a component that uses feedback to maintain an output signal in a specific phase or frequency relationship with an input signal. In the case of a computer system, a PLL is used to synchronize the microprocessor ("chip") clock with the external ("system") clock. Such synchronization is necessary because a chip clock typically operates at a much greater frequency than the system clock. Consequently, the PLL operates at the same higher frequency because it serves the chip clock.

FIG. 1 shows a prior art overview of a clock distribution system. The computer system 10 broadly includes an input/output ("IO") ring 12 that is external to the microprocessor chip or "core" 14 of the system. The system clock signal 16 is fed through the IO ring 12 to the PLL 15 inside the core 14. The PLL 15, after synchronizing the system clock signal with the chip clock signal, feeds it to a global clocking grid 18 for the chip. The global clocking grid 18 feeds the signal data/scan paths and various components such as system latches 22, local clocking grids 20, and a feed back loop 26 that returns to the PLL 15. The local clocking grids 20 feed the base components of the core 14 such as flip-flops 24 which as basic data storage devices.

The PLL clock signal 28 is also sampled after the PLL 15 in order to analyze the signal performance off chip. Specifically, the PLL signal 28 is checked for the effects of system noise (called "jitter") and timing errors (called "skew"). However, difficulties arise in trying to observe the PLL signal 28 because it is often operating at frequencies up to 3 GHz. The off-chip drivers that drive the signal 28 generally cannot support this speed because they operate at lower frequencies. While a few clock edges might be observed, the higher frequency energy that causes the problems that are trying to be detected will be filtered out. A solution is needed that allows for observation and analysis of all the clock edges.

SUMMARY OF INVENTION

In some aspects, the invention relates to a method for dividing a clock signal into multiple phases, comprising: inputting the clock signal to a clock divider segment group, wherein the clock divider segment group comprises at least one clock divider segment; generating a first half of the multiple phases with the clock divider segment group; and generating a second half of the multiple phases with an inverse output from the clock divider segment group.

In other aspects, the invention relates to a method for dividing a clock signal, comprising: inputting the clock signal to a divider; generating a first phase of the clock signal with the divider; generating a second phase of the clock signal with the divider, wherein the second phase lags behind the first phase by one clock cycle; generating a third phase of the clock signal by inverting the first phase; and generating a fourth phase of the clock signal by inverting the second phase.

In other aspects, the invention relates to an apparatus for dividing a clock signal, comprising: a means for inputting the clock signal to a divider; means for generating multiple initial phases of the clock signal with the divider; and means for generating an multiple additional phases of the clock signal by inverting corresponding initial phases of the clock signal.

In other aspects, the invention relates to an apparatus for dividing a clock signal, comprising: a divider input that receives the clock signal; a first phase generator that generates a first phase of the clock signal; a second phase generator that generates a second phase of the clock signal, wherein the second phase lags behind the first phase by one clock cycle; a third phase generator that generates a third phase of the clock signal by inverting the first phase; and a fourth phase generator that generates a fourth phase of the clock signal by inverting the second phase.

Other aspects and advantages of the invention will be apparent from the following description and the appended claims.

DETAILED DESCRIPTION

Figure 1:
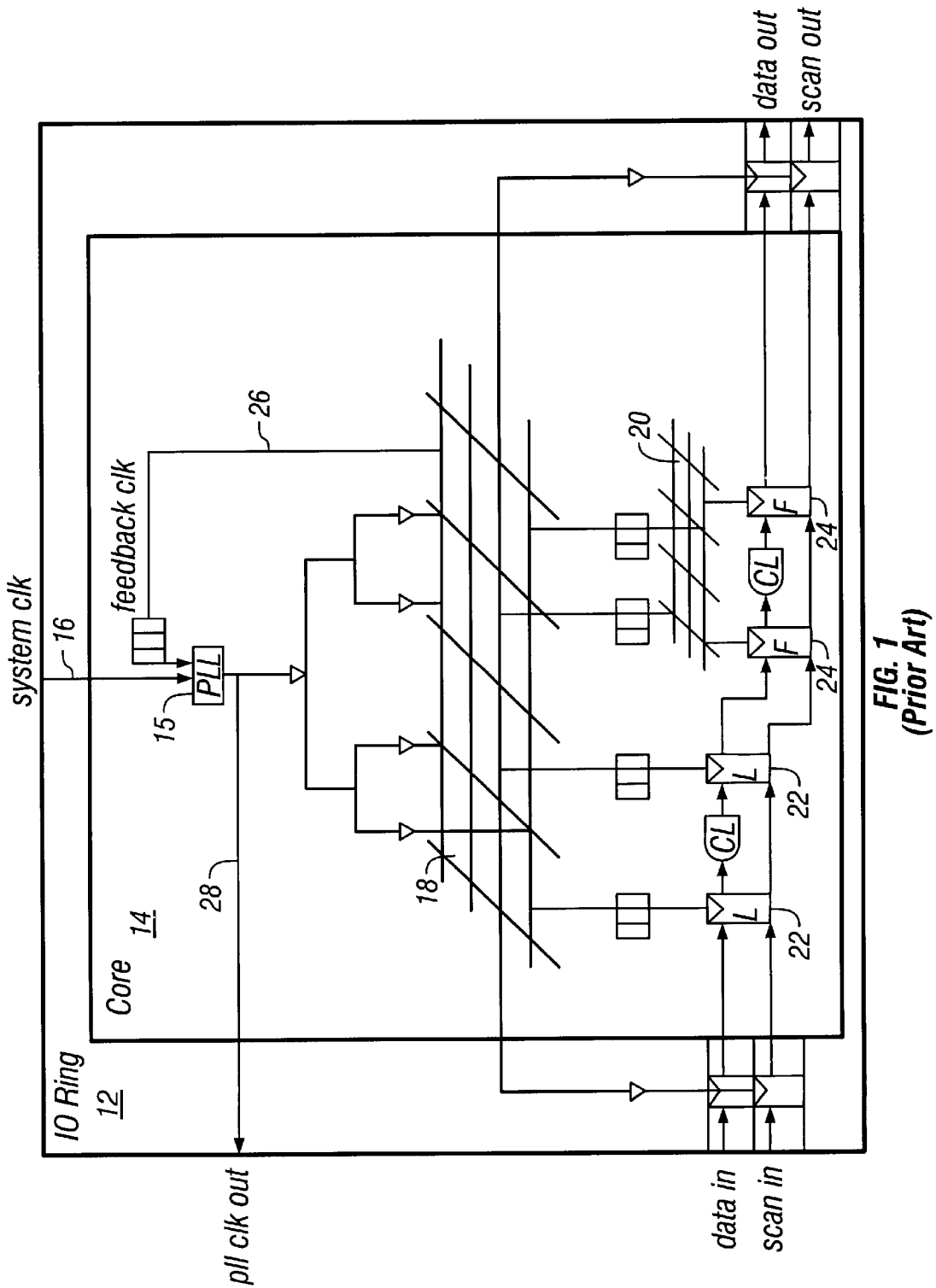
FIG. 1 shows a prior art overview of a clock distribution system.

Exemplary embodiments of the invention will be described with reference to the accompanying drawings. Like items in the drawings are shown with the same reference numbers.

Figure 2:
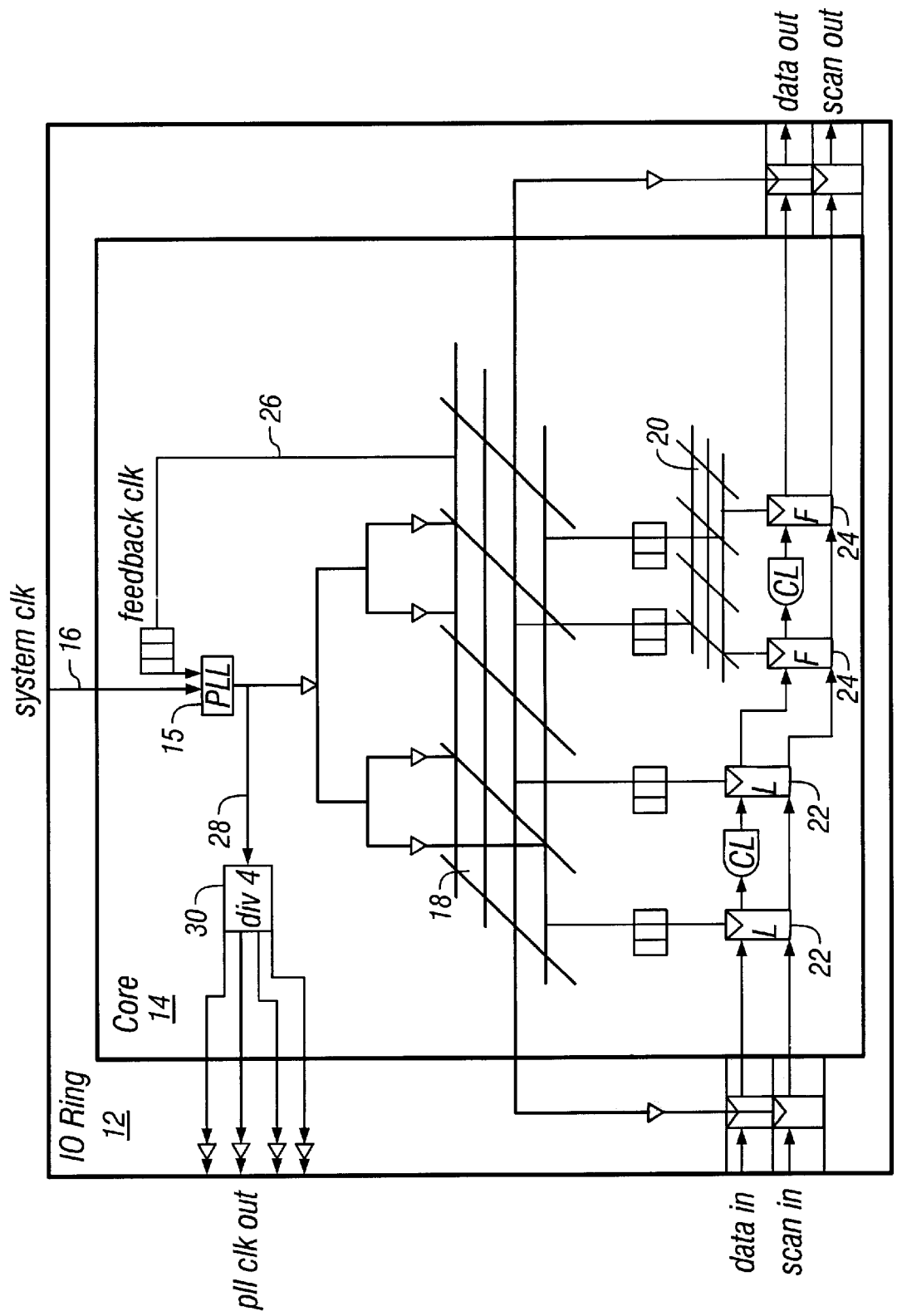
FIG. 2 shows an overview of a clock distribution system in accordance with one embodiment of the present invention.

FIG. 2 shows an overview of a clock distribution system in accordance with one embodiment of the present invention. The clock distribution system 10 of FIG. 2 is configured in the same arrangement as the prior art system shown in FIG. 1 with the exception of the addition of a clock signal divider 30 for the PLL clock signal 28. The clock divider, as shown in this embodiment, divides the PLL signal 28 into four separate phases that are observed off-chip.

Figure 3:
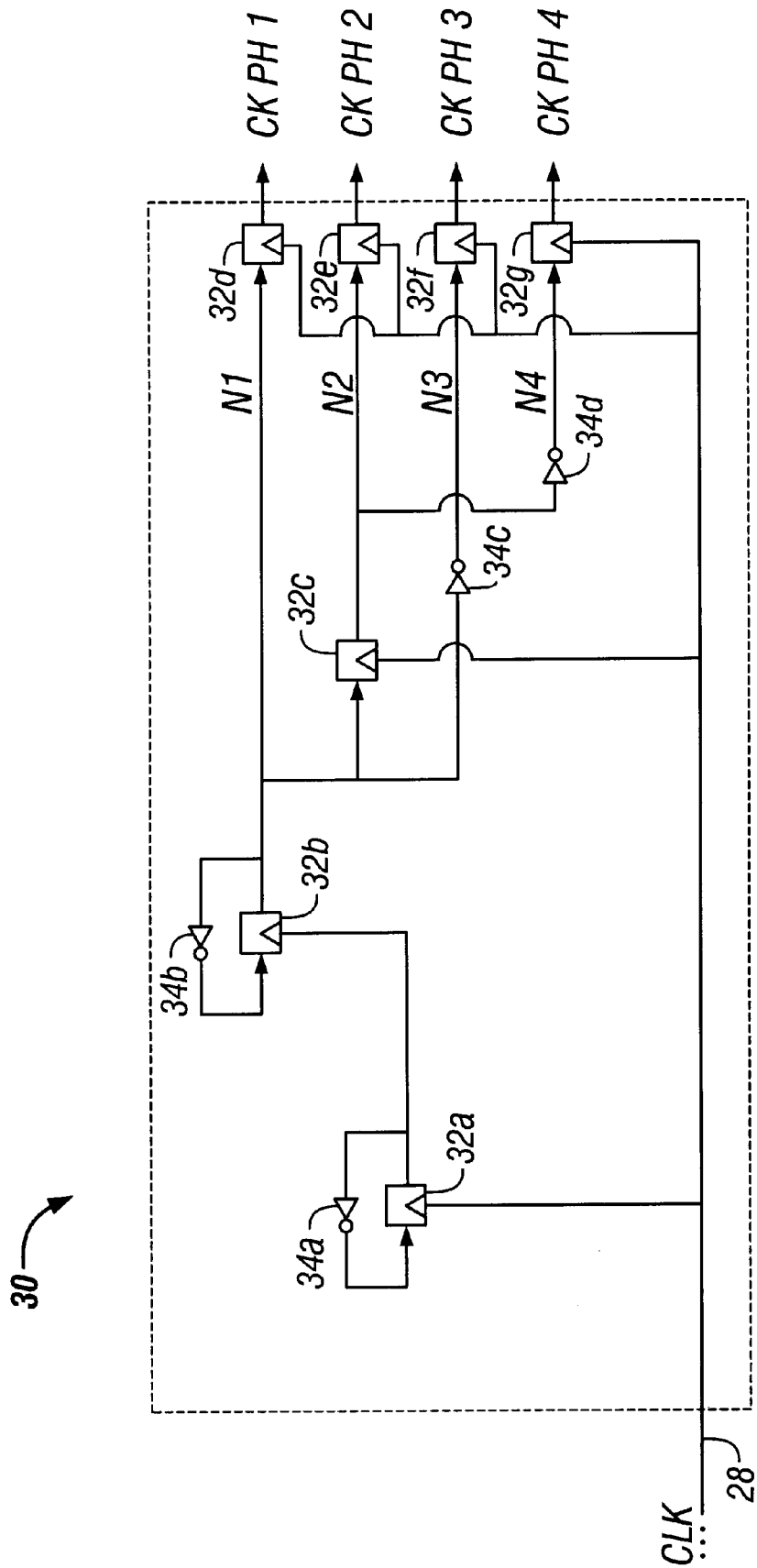
FIG. 3 shows a schematic of a clock divider circuit in accordance with one embodiment of the present invention.

FIG. 3 shows a schematic of a clock divider circuit in accordance with one embodiment of the present invention. The PLL clock signal 28 ("CLK") is input into the clock signal divider 30. CLK 28 is used to initiate the operation of the first and third through seventh flip-flops 32a, 32c–32g. The second flip-flop 32b is initiated by the output of the first flip-flop 32a. Both the first and second flip-flops 32a and 32b have inputs that are fed back from their respective outputs. Both outputs are fed through a single inverter 34a and 34b before being input into their respective flip-flops 32a and 32b.

The output of the second flip-flop 32b is the first phase of the division of the clock signal 28. It is referred to as "N1". The N1 output is also input into the third flip-flop 32c. The output of the third flip-flop 32c is effectively delayed one cycle behind N1 by the flip-flop 32c. This output is the second phase of the division of the clock signal 28. It is referred to as "N2". The N1 output is also fed through an inverter 34c. The output of this inverter 34c is the third phase of the division of the clock signal 28. It is referred to as "N3". The N2 output is also fed through an inverter 34d. The output of this inverter 34d is the fourth phase of the division of the clock signal. It is referred to as "N4". The four phases of the signal N1, N2, N3, and N4 are each input into a separate flip-flop 32d–32g for each phase. The outputs of this bank of four flip-flops 32d–32g are collectively output from the divider 30 as respective phase signals CKPH1, CKPH2, CKPH3, and CKPH4. These phase signals CKPH1, CKPH2, CKPH3, and CKPH4 are capable of being analyzed for errors without the problems associated with the high frequency of the original clock signal 28.

In accordance with FIG. 3, flip-flops 32a and 32b with feedback inverters 34a and 34b and flip-flop 32c together form an example of a means for generating multiple initial phases. Inverters 34c and 34d together form an example of a means for generating multiple additional phases. In another aspect, flip-flops 32a and 32b with feedback inverters 34a and 34b form an example of a first phase generator. Flip-flops 32a and 32b with feedback inverters 34a and 34b and flip-flop 32c form an example of a second phase generator. Inverter 34c forms an example of a third phase generator. Inverter 34d forms an example of a fourth phase generator. Flip-flops 32d–32g form an example of an alignment generator that aligns the phases based on a timing of the clock signal.

Figure 4:
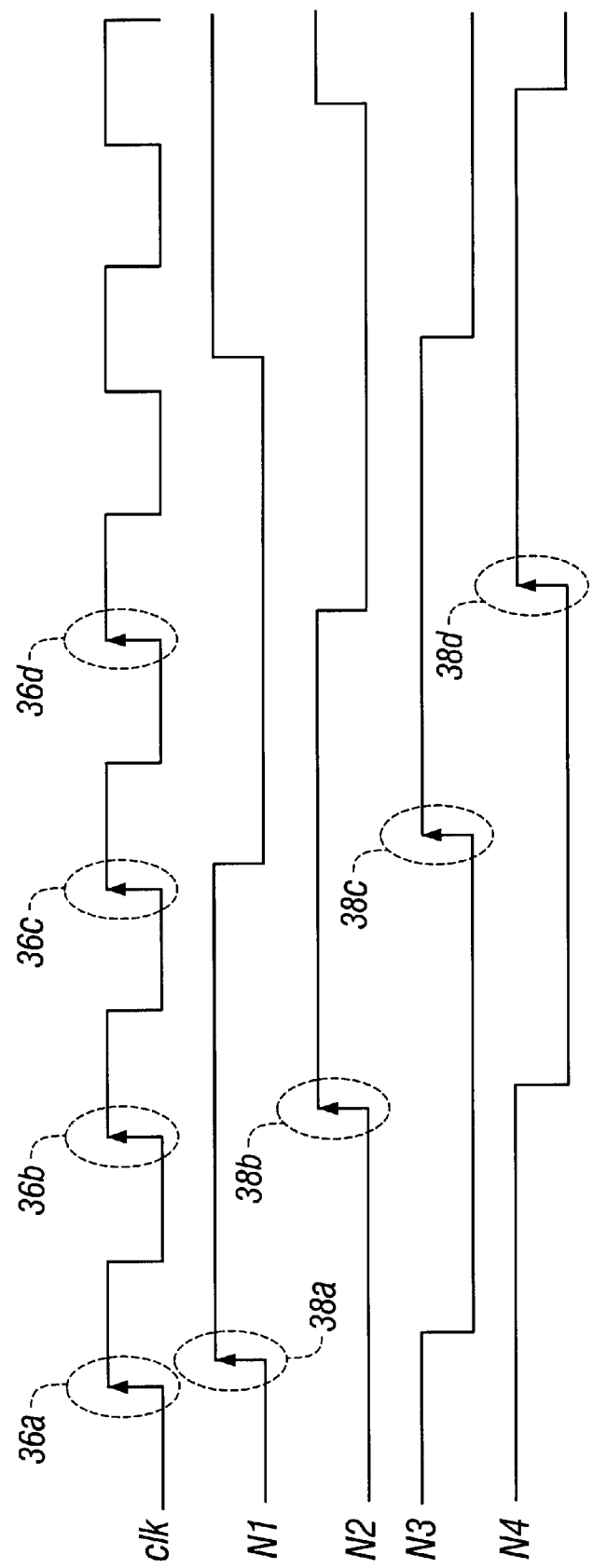
FIG. 4 shows a timing diagram of the clock divider circuit show in FIG. 3 in accordance with one embodiment of the present invention.

FIG. 4 shows a timing diagram of the clock divider circuit show in FIG. 3 in accordance with one embodiment of the present invention. The CLK diagram is shown with leading edges 36a–36d of the first four clock cycles that are to be divided out. N1 shows the timing diagram of the first clock phase CKPH1. The leading edge of N1 38a corresponds to the first leading edge 36a of the first clock cycle of CLK. N2 shows the timing diagram of the second clock phase CKPH2. The leading edge of N2 38b corresponds to the leading edge 36b of the second clock cycle of CLK. N3 shows the timing diagram of the third clock phase CKPH3. The leading edge of N3 38c corresponds to the leading edge 36c of the third clock cycle of CLK. Finally, N4 shows the timing diagram of the fourth clock phase CKPH4. The leading edge of N4 38d corresponds to the leading edge 36d of the fourth clock cycle of CLK.

Each of the HIGH segments of timing diagrams of the phases N1, N2, N3 and N4 lasts for two cycles of the CLK diagram. This demonstrates that the timing of the phases N1, N2, N3 and N4 has been slowed to one quarter of the frequency of the CLK, in effect dividing the CLK by four. For example, a CLK signal running at a speed of 3 GHz, will be divided into four separate phases running at a speed of 750 MHz each. This allows a sufficient cycle duration of the phases N1, N2, N3 and N4 to allow for off-chip analysis of that cycle for jitter and skew. It is significant to note that the N3 phase is simply the inverse of the N1 phase and the N4 phase is simply the inverse of the N2 phase. This is due to the respective inverters 34c and 34d shown in FIG. 3. The inversion of these signals results in a slight timing delay between the N2 and N3 phases.

Figure 5:
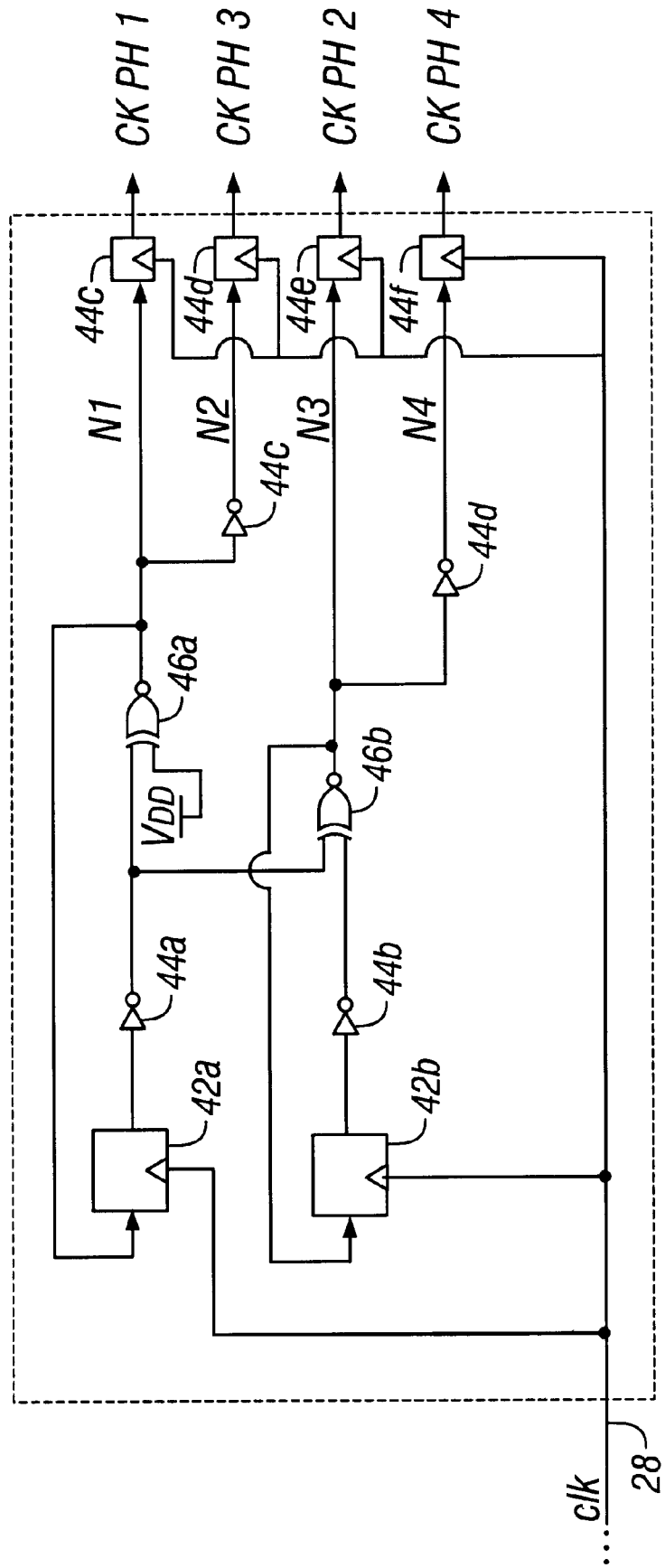
FIG. 5 shows a schematic of a clock divider circuit in accordance with an alternative embodiment of the present invention.

FIG. 5 shows a schematic of a clock divider circuit in accordance with an alternative embodiment of the present invention. In this embodiment, the PLL clock signal 28 (CLK) is input into the clock divider circuit 40. The CLK signal serves to initiate the operation of a first flip-flop 42a and a second flip-flop 42b. The outputs of each of the flip-flops 42a and 42b is input into a respective inverter 44a and 44b. The output of the inverters 44a and 44b is an input into a respective XNOR gate 46a and 46b. The other input to the first XNOR gate 46a is the system power supply ($V_{DD}$). The other input to the second XNOR gate 46b is the output of the first inverter 44a. The outputs of the XNOR gates 46a and 46b are fed back to the inputs of their respective flip-flops 42a and 42b.

The output of the first XNOR gate 46a is the first phase of the division of the clock signal 28. It is referred to as "N1". The N1 phase is input into a third inverter 44c. The output of this inverter 44c is the third phase of the division of the clock signal 28. It is referred to as "N3". The output of the second XNOR gate 46b is the second phase of the division of the clock signal 28. It is referred to as "N2". The N2 phase is input into a fourth inverter 44d. The output of this inverter 44d is the fourth phase of the division of the clock signal 28. It is referred to as "N4". The four phases N1, N2, N3, and N4 generated by the circuit 40 in FIG. 5 are the same as the four phases N1, N2, N3, and N4 generated by the circuit 30 in FIG. 3. As in the previous embodiment shown in FIG. 3, the four phases of the signal N1, N3, N2, and N4 are each input into a separate flip-flop 44c–44f for each phase. The outputs of this bank of four flip-flops 44c–44f are collectively output from the divider 40 as respective phase signals CKPH1, CKPH3, CKPH2, and CKPH4. These phase signals CKPH1, CKPH3, CKPH2, and CKPH4 are capable of being analyzed for errors without the problems associated with the high frequency of the original clock signal 28.

Since the outputs of the embodiments shown in FIGS. 3 and 5 are the same, it follows that FIG. 4 shows the timing diagrams of the phase outputs for the embodiment of FIG. 5 as well. In FIG. 4, the CLK diagram is shown with leading edges 36a–36d of the first four clock cycles that are to be divided out. N1 shows the timing diagram of the first clock phase CKPH1. The leading edge of N1 38a corresponds to the first leading edge 36a of the first clock cycle of CLK. N2 shows the timing diagram of the second clock phase CKPH2. The leading edge of N2 38b corresponds to the leading edge 36b of the second clock cycle of CLK. N3 shows the timing diagram of the third clock phase CKPH3. The leading edge of N3 38c corresponds to the leading edge 36c of the third clock cycle of CLK. Finally, N4 shows the timing diagram of the fourth clock phase CKPH4. The leading edge of N4 38d corresponds to the leading edge 36d of the fourth clock cycle of CLK.

Each of the HIGH segments of timing diagrams of the phases N1, N2, N3 and N4 lasts for two cycles of the CLK diagram. This demonstrates that the timing of the phases N1, N2, N3 and N4 has been slowed to one quarter of the frequency of the CLK, in effect dividing the CLK by four. For example, a CLK signal running at a speed of 3 GHz, will be divided into four separate phases running at a speed of 750 MHz each. This allows a sufficient cycle duration of the phases N1, N2, N3 and N4 to allow for off-chip analysis of that cycle for jitter and skew. It is significant to note that the N3 phase is simply the inverse of the Ni phase and the N4 phase is simply the inverse of the N2 phase. This is due to the respective inverters 44c and 44d shown in FIG. 5. The inversion of these signals results in a slight timing delay between the N2 and N3 phases.

In alternative embodiments, the degree of division of the signal is scalable. In the previously described embodiments shown in FIGS. 3 and 5, the signal was divided into four phases. In alternative embodiments, the number of division phases could be increased or decreased by simply adding or deleting any number of circuit dividing segments as needed.

For example in FIG. 3, the circuit could be converted to divide the clock signal by eight by simply adding two additional flip-flops and two additional inverters. Specifically, the circuitry arrangement to generate N1 and N2 would remain the same as shown in FIG. 3. The input for the first additional flip-flop would be taken from N2 and its output would be N3. The input for the second additional flip-flop would be taken from N3 and its output would be N4. Thus, the first four phases N1, N2, N3, and N4 are generated by outputs from respective flip-flops. The last four phases N5, N6, N7, and N8 are generated by inverting the corresponding signal from the first four phases. Specifically, N1 is inverted to generate N5; N2 is inverted to generate N6; N3 is inverted to generate N7; and N4 is inverted to generated N8. The same technique could be used with the circuit dividing segments of the embodiment shown in FIG. 5.

This principle uses clock divider segments to generate the first half of the total number of output phases. The outputs of the clock divider segments are then inverted to generate the last half of the total number of output phases. In the embodiment shown in FIG. 3, one clock divider segment includes one flip-flop 32c whose input is the preceding output phase N1 of the previous flip-flop 32b. The output of this clock divider segment N2 is inverted 34d to generate N4. In the embodiment shown in FIG. 5, the clock divider segment includes a flip-flop 42b, an inverter 44b, and an XNOR gate 46b arranged as shown. The output of this clock divider segment N2 is inverted 44d to generate N4.

While all of the previously described embodiments have monitored the rising edge of the clock cycle for jitter and skew, it is possible to monitor the falling edge of a clock cycle as well. Implementation of the falling edge clock divider simply involves inverting the CLK signal input 28 as shown in FIGS. 3 and 5. The CLK signal input 28 is inverted prior to being input into any flip-flops of the respective circuits 30 and 40.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for dividing a clock signal into multiple phases, comprising:
   inputting the clock signal to a clock divider segment group, wherein the clock divider segment group comprises at least one clock divider segment;
   generating a first half of the multiple phases with the clock divider segment group;
   generating a second half of the multiple phases with an inverse output from the clock divider segment group; and
   aligning the first half and the second half of the multiple phases based on a timing of the clock signal.

2. The method of claim 1, wherein the clock signal is generated by a phased locked loop.

3. The method of claim 1, wherein the multiple phases of the clock signal correspond to the rising edges of the clock signal.

4. The method of claim 1, wherein the multiple phases of the clock signal correspond to the falling edges of the clock signal.

5. The method of claim 1, further comprising:
   outputting all phases of the clock signal to an off-chip clock signal monitor.

6. A method for dividing a clock signal, comprising:
   inputting the clock signal to a divider;
   generating a first phase of the clock signal with the divider;
   generating a second phase of the clock signal with the divider, wherein the second phase lags behind the first phase by one clock cycle;
   generating a third phase of the clock signal by inverting the first phase;
   generating a fourth phase of the clock signal by inverting the second phase; and
   aligning the first phase, the second phase, the third phase, and the fourth phase of the clock signal based on a timing of the clock signal.

7. The method of claim 6, wherein the clock signal is generated by a phased locked loop.

8. The method of claim 6, wherein the first, second, third, and fourth phases of the clock signal correspond to the rising edges of the clock signal.

9. The method of claim 6, wherein the first, second, third, and fourth phases of the clock signal correspond to the falling edges of the clock signal.

10. The method of claim 6, further comprising:
    outputting all phases of the clock signal to an off-chip clock signal monitor.

11. An apparatus for dividing a clock signal, comprising:
    a means for inputting the clock signal to a divider;
    means for generating multiple initial phases of the clock signal with the divider;
    means for generating multiple additional phases of the clock signal by inverting the corresponding initial phases of the clock signal; and
    means for aligning the multiple initial phases and the multiple additional phases of the clock signal based on a timing of the clock signal.

12. An apparatus for dividing a clock signal, comprising:
    a divider input that receives the clock signal;
    a first phase generator that couples to the divider input and generates a first phase of the clock signal;
    a second phase generator that couples to the divider input and generates a second phase of the clock signal, wherein the second phase lags behind the first phase by one clock cycle;
    a third phase generator that couples to the first phase and generates a third phase of the clock signal by inverting the first phase;
    a fourth phase generator that couples to the second phase and generates a fourth phase of the clock signal by inverting the second phase; and
    an alignment generator that couples to and aligns each of the first phase, the second phase, the third phase, and the fourth phase based on a timing of the clock signal.

13. The apparatus of claim 12, wherein the clock signal is generated by a phased locked loop.

14. The apparatus of claim 12, wherein the first, second, third, and fourth phases of the clock signal correspond to the rising edges of the clock signal.

15. The apparatus of claim 12, wherein the first, second, third, and fourth phases of the clock signal correspond to the falling edges of the clock signal.

* * * * *